US012167568B2

(12) United States Patent
Bauchart et al.

(10) Patent No.: US 12,167,568 B2
(45) Date of Patent: Dec. 10, 2024

(54) RACK SYSTEM FOR HOUSING AT LEAST ONE IMMERSION CASE

(71) Applicant: OVH, Roubaix (FR)

(72) Inventors: Gregory Francis Louis Bauchart, Wattrelos (FR); Alexandre Alain Jean-Pierre Meneboo, Harnes (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 192 days.

(21) Appl. No.: 17/707,200

(22) Filed: Mar. 29, 2022

(65) Prior Publication Data
US 2022/0322577 A1    Oct. 6, 2022

(30) Foreign Application Priority Data

Apr. 1, 2021    (EP) .................................... 21305427
Aug. 31, 2021    (EP) .................................... 21306188

(51) Int. Cl.
     *H05K 7/20*      (2006.01)
     *F28D 21/00*      (2006.01)
     (Continued)

(52) U.S. Cl.
     CPC ......... *H05K 7/20236* (2013.01); *F28D 21/00* (2013.01); *F28F 3/027* (2013.01);
     (Continued)

(58) Field of Classification Search
     CPC ............. H05K 7/20236; H05K 7/1488; H05K 7/1489; H05K 7/20245; H05K 7/20254;
     (Continued)

(56) References Cited

U.S. PATENT DOCUMENTS 2,115,501 A    4/1938    Sergius
2,316,296 A    4/1943    Simonds
(Continued)

FOREIGN PATENT DOCUMENTS

CN    201898432 U    7/2011
CN    103687443 A    3/2014
(Continued)

OTHER PUBLICATIONS

Office Action with regard to the counterpart U.S. Appl. No. 17/694,765 mailed Dec. 21, 2023.
(Continued)

*Primary Examiner* — Elizabeth J Martin
*Assistant Examiner* — Dario Antonio Deleon
(74) *Attorney, Agent, or Firm* — BCF LLP

(57) ABSTRACT

A rack system which includes a rack frame and at least one reservoir for housing at least one rack-mounted immersion case is disclosed. The rack frame is configured to slidably accommodate racking and de-racking operations of the at least one rack-mounted immersion case. The at least one collapsible reservoir, which is configured to store a fluid therein, is fluidly connected to the at least one rack-mounted immersion case, has a first portion fixedly connected to the at least one rack-mounted immersion case, and a second portion fixedly connected to the rack frame. The at least one collapsible reservoir is configured to respectively collapse and expand along a racked space and a de-racked space, the racked and de-racked spaces being defined between a backplane of the at least one rack-mounted immersion case and a backplane of the rack frame, the de-racked space being larger than the racked space.

14 Claims, 5 Drawing Sheets

(51) Int. Cl.
  *F28F 3/02*    (2006.01)
  *G06F 1/20*    (2006.01)
  *H01L 23/44*   (2006.01)
  *H01L 23/473*  (2006.01)
  *H05K 7/14*    (2006.01)

(52) U.S. Cl.
  CPC ............... *G06F 1/20* (2013.01); *G06F 1/206* (2013.01); *H01L 23/44* (2013.01); *H01L 23/473* (2013.01); *H05K 7/1488* (2013.01); *H05K 7/1489* (2013.01); *H05K 7/20245* (2013.01); *H05K 7/20254* (2013.01); *H05K 7/20263* (2013.01); *H05K 7/20272* (2013.01); *H05K 7/203* (2013.01); *H05K 7/20327* (2013.01); *H05K 7/20336* (2013.01); *H05K 7/20763* (2013.01); *H05K 7/20772* (2013.01); *H05K 7/20781* (2013.01); *H05K 7/20809* (2013.01); *H05K 7/20818* (2013.01); *F28D 2021/0029* (2013.01); *G06F 2200/201* (2013.01)

(58) Field of Classification Search
  CPC ........... H05K 7/20263; H05K 7/20272; H05K 7/203; H05K 7/20327; H05K 7/20336; H05K 7/20763; H05K 7/20772; H05K 7/20781; H05K 7/20809; H05K 7/20818; H05K 7/1401; H05K 7/1485; H05K 7/20681; F28D 21/00; F28D 2021/0029; F28F 3/027; G06F 1/20; G06F 1/206; G06F 2200/201; H01L 23/44; H01L 23/473; H01L 23/3672
  See application file for complete search history.

(56) References Cited

U.S. PATENT DOCUMENTS

| | | |
|---|---|---|
| 3,938,689 A | 2/1976 | De Munnik |
| 4,279,966 A | 7/1981 | Wakana et al. |
| 4,619,316 A | 10/1986 | Nakayama et al. |
| 4,888,664 A | 12/1989 | Rojc |
| 5,268,814 A | 12/1993 | Yakubowski |
| 5,307,956 A | 5/1994 | Richter et al. |
| 5,669,524 A | 9/1997 | Loedel |
| 5,907,473 A | 5/1999 | Przilas et al. |
| 6,023,934 A | 2/2000 | Gold |
| 6,746,388 B2 | 6/2004 | Edwards et al. |
| 6,847,525 B1 | 1/2005 | Smith et al. |
| 6,883,593 B2 | 4/2005 | Johnson et al. |
| 6,899,164 B1 | 5/2005 | Li et al. |
| 7,369,410 B2 | 5/2008 | Chen et al. |
| 7,403,392 B2 | 7/2008 | Attlesey et al. |
| 7,414,845 B2 | 8/2008 | Attlesey et al. |
| 7,527,085 B2 | 5/2009 | Iijima et al. |
| 7,724,517 B2 | 5/2010 | Attlesey et al. |
| 7,885,070 B2 | 2/2011 | Campbell et al. |
| 7,900,796 B2 | 3/2011 | Ungrady et al. |
| 7,905,106 B2 | 3/2011 | Attlesey |
| 7,911,782 B2 | 3/2011 | Attlesey et al. |
| 7,911,793 B2 | 3/2011 | Attlesey |
| 8,009,419 B2 | 8/2011 | Attlesey et al. |
| 8,014,150 B2 | 9/2011 | Campbell et al. |
| 8,089,764 B2 | 1/2012 | Attlesey |
| 8,089,765 B2 | 1/2012 | Attlesey |
| 8,089,766 B2 | 1/2012 | Attlesey |
| 8,291,964 B2 | 10/2012 | Hwang et al. |
| 8,305,759 B2 | 11/2012 | Attlesey et al. |
| 8,467,189 B2 | 6/2013 | Attlesey |
| 8,619,425 B2 | 12/2013 | Campbell et al. |
| 8,654,529 B2 | 2/2014 | Tufty et al. |
| 8,934,244 B2 | 1/2015 | Shelnutt et al. |
| 8,953,317 B2 | 2/2015 | Campbell et al. |
| 9,049,800 B2 | 6/2015 | Shelnutt et al. |
| 9,051,502 B2 | 6/2015 | Sedarous et al. |
| 9,086,859 B2 | 7/2015 | Tufty et al. |
| 9,128,681 B2 | 9/2015 | Tufty et al. |
| 9,144,179 B2 | 9/2015 | Shelnutt et al. |
| 9,155,230 B2 | 10/2015 | Eriksen |
| 9,176,547 B2 | 11/2015 | Tufty et al. |
| 9,195,282 B2 | 11/2015 | Shelnutt et al. |
| 9,223,360 B2 | 12/2015 | Tufty et al. |
| 9,328,964 B2 | 5/2016 | Shelnutt et al. |
| 9,335,802 B2 | 5/2016 | Shelnutt et al. |
| 9,351,429 B2 | 5/2016 | Shelnutt et al. |
| 9,382,914 B1 | 7/2016 | Sharfi |
| 9,426,927 B2 | 8/2016 | Shafer et al. |
| 9,436,235 B2 | 9/2016 | Damaraju et al. |
| 9,464,854 B2 | 10/2016 | Shelnutt et al. |
| 9,529,395 B2 | 12/2016 | Franz et al. |
| 9,699,938 B2 | 7/2017 | Shelnutt et al. |
| 9,699,939 B2 | 7/2017 | Smith |
| 9,717,166 B2 | 7/2017 | Eriksen |
| 9,756,766 B2 | 9/2017 | Best |
| 9,773,526 B2 | 9/2017 | Shelnutt et al. |
| 9,781,859 B1 | 10/2017 | Wishman et al. |
| 9,795,065 B2 | 10/2017 | Shelnutt et al. |
| 9,839,164 B2 | 12/2017 | Shelnutt et al. |
| 9,844,166 B2 | 12/2017 | Shelnutt et al. |
| 9,921,622 B2 | 3/2018 | Shelnutt et al. |
| 9,968,010 B2 | 5/2018 | Shelnutt et al. |
| 9,992,914 B2 | 6/2018 | Best et al. |
| 10,010,013 B2 | 6/2018 | Shelnutt et al. |
| 10,018,425 B2 | 7/2018 | Shelnutt et al. |
| 10,020,242 B2 | 7/2018 | Katsumata et al. |
| 10,064,314 B2 | 8/2018 | Shelnutt et al. |
| 10,104,808 B2 | 10/2018 | Scharinger et al. |
| 10,130,008 B2 | 11/2018 | Shepard et al. |
| 10,143,113 B2 | 11/2018 | Shelnutt et al. |
| 10,143,114 B2 | 11/2018 | Shelnutt et al. |
| 10,146,231 B2 | 12/2018 | Shelnutt et al. |
| 10,149,408 B2 | 12/2018 | Fujiwara et al. |
| 10,156,873 B2 | 12/2018 | Shelnutt et al. |
| 10,172,262 B2 | 1/2019 | Shelnutt et al. |
| 10,206,312 B2 | 2/2019 | Shelnutt et al. |
| 10,212,857 B2 | 2/2019 | Eriksen |
| 10,225,958 B1 | 3/2019 | Gao |
| 10,238,010 B2 | 3/2019 | Shelnutt et al. |
| 10,271,456 B2 | 4/2019 | Tufty et al. |
| 10,321,609 B2 | 6/2019 | Hirai et al. |
| 10,331,144 B2 | 6/2019 | Shelnutt et al. |
| 10,399,190 B2 | 9/2019 | North et al. |
| 10,542,635 B2 | 1/2020 | Nishiyama |
| 10,598,441 B2 | 3/2020 | Kawabata et al. |
| 10,617,042 B2 | 4/2020 | Shelnutt et al. |
| 10,622,283 B2 | 4/2020 | Leobandung |
| 10,624,236 B2 | 4/2020 | Inano et al. |
| 10,624,242 B2 | 4/2020 | Best |
| 10,638,641 B2 | 4/2020 | Franz et al. |
| 10,645,841 B1 | 5/2020 | Mao et al. |
| 10,653,036 B1 | 5/2020 | Gao |
| 10,667,434 B1 | 5/2020 | Mao et al. |
| 10,674,641 B2 | 6/2020 | Shepard et al. |
| 10,716,238 B2 | 7/2020 | Brink |
| 10,729,039 B2 | 7/2020 | Shelnutt et al. |
| 10,791,647 B1 | 9/2020 | Miyamura et al. |
| 10,809,011 B2 | 10/2020 | Chu et al. |
| 10,871,807 B2 | 12/2020 | Best et al. |
| 10,888,032 B2 | 1/2021 | Wakino et al. |
| 10,917,998 B2 | 2/2021 | Shelnutt et al. |
| 10,932,390 B2 | 2/2021 | Korikawa |
| 10,939,580 B2 | 3/2021 | Gao |
| 10,939,581 B1 | 3/2021 | Chen et al. |
| 10,990,144 B2 | 4/2021 | Wang et al. |
| 11,006,547 B2 | 5/2021 | Gao |
| 11,032,939 B2 | 6/2021 | Tufty et al. |
| 11,071,238 B2 | 7/2021 | Edmunds et al. |
| 11,107,749 B2 | 8/2021 | Taniguchi et al. |
| 11,268,739 B2 | 3/2022 | Wang et al. |
| 11,572,614 B2 | 2/2023 | Sakamoto et al. |
| 11,751,359 B2 | 9/2023 | Heydari |
| 11,822,398 B2 | 11/2023 | Heydari |
| 2002/0159233 A1 | 10/2002 | Patel et al. |

(56) References Cited

U.S. PATENT DOCUMENTS

| | | |
|---|---|---|
| 2004/0244947 A1 | 12/2004 | Chen |
| 2005/0150637 A1 | 7/2005 | Tan et al. |
| 2005/0248922 A1* | 11/2005 | Chu et al. .......... H05K 7/20809 361/700 |
| 2007/0227756 A1 | 10/2007 | Doerr et al. |
| 2009/0146294 A1 | 6/2009 | Hillman et al. |
| 2009/0205590 A1 | 8/2009 | Vetrovec |
| 2009/0260777 A1 | 10/2009 | Attlesey |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St Rock et al. |
| 2012/0058588 A1 | 3/2012 | Mayer et al. |
| 2012/0075797 A1 | 3/2012 | Attlesey |
| 2012/0120599 A1 | 5/2012 | Chua et al. |
| 2012/0193068 A1 | 8/2012 | Nemesh et al. |
| 2013/0105120 A1 | 5/2013 | Campbell et al. |
| 2014/0123492 A1 | 5/2014 | Campbell et al. |
| 2014/0216688 A1 | 8/2014 | Shelnutt et al. |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | St Rock et al. |
| 2016/0021793 A1 | 1/2016 | Chen |
| 2016/0120059 A1 | 4/2016 | Shedd et al. |
| 2016/0305565 A1 | 10/2016 | Miller et al. |
| 2016/0330874 A1 | 11/2016 | Sato et al. |
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1 | 5/2017 | Campbell et al. |
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | Wei et al. |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1 | 3/2020 | Enright et al. |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| NO | 2020234600 A1 | 11/2020 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020/234600 A1 | 11/2020 |
| WO | 2020223806 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

International Search Report and Written Opinion with regard to PCTIB2022053071 mailed Jun. 28, 2022.

International Search Report and Written Opinion with regard to PCT/IB2022/052975 mailed Jun. 20, 2022.

International Search Report and Written Opinion with regard to PCTIB2022052330 mailed May 30, 2022.

International Search Report and Written Opinion with regard to PCT/IB2022/052976 mailed Jun. 17, 2022.

International Search Report and Written Opinion with regard to PCT/IB2022/052977 mailed Jun. 20, 2022.

European Search Report with regard to EP21306170.8 completed Feb. 12, 2022.

(56) References Cited

OTHER PUBLICATIONS

European Search Report with regard to EP21306189.8 completed Feb. 10, 2022.
Notice of Allowance with regard to the counterpart U.S. Appl. No. 17/691,494 mailed Apr. 17, 2023.
Office Action with regard to the counterpart U.S. Appl. No. 17/698,480 mailed Sep. 7, 2023.
"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.
"IBM's Hot-Water Supercomputer Goes Live", Data Center Knowledge, retrieved on Jul. 19, 2021, 9 pages.
Extended European Search Report with regard to the EP Patent Application No. 21306771.3 completed May 23, 2022.
Extended European Search Report with regard to the EP Patent Application No. 21306173.2 completed Feb. 18, 2022.
Extended European Search Report with regard to the EP Patent Application No. 21306174.0 completed Feb. 14, 2022.
Extended European Search Report with regard to the EP Patent Application No. 21306172.4 completed Feb. 15, 2022.
English Abstract for JP2020065002 retrieved on Espacenet on Jun. 2, 2022.
Extended European Search Report with regard to the EP Patent Application No. 21306186.4 completed Feb. 10, 2022.
Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Office Action with regard to te counterpart CN Patent Application No. 2022103375051 issued May 11, 2024.
Office Action with regard to the counterpart U.S. Appl. No. 17/701,422 mailed Mar. 28, 2023.
Office Action with regard to te counterpart U.S. Appl. No. 17/690,839 issued Jun. 25, 2024.
Notice of Allowance with regard to te counterpart U.S. Appl. No. 17/697,616 issued Jul. 23, 2024.
Office Action with regard to the counterpart U.S. Appl. No. 17/698,037 mailed Feb. 26, 2024.
Office Action with regard to the counterpart U.S. Appl. No. 17/697,616 mailed Feb. 26, 2024.
Notice of Allowance with regard to the counterpart U.S. Appl. No. 17/690,839 mailed Mar. 5, 2024.
Office Action with regard to the counterpart U.S. Appl. No. 17/697,452 mailed May 11, 2023.
Office Action with regard to the counterpart U.S. Appl. No. 17/697,264 mailed Nov. 22, 2023.
Office Action with regard to the counterpart U.S. Appl. No. 17/697,452 mailed Nov. 22, 2023.
Extended European Search Report with regard to the counterpart EP Patent Application No. 22305018.8 completed Jun. 24, 2022.
Office Action with regard to te counterpart U.S. Appl. No. 17/698,480 issued Jul. 3, 2024.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Notice of Allowance with regard to the counterpart U.S. Appl. No. 17/707,200 issued Aug. 15, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.
Office Action with regard to the counterpart CN Patent Application No. 2022103478109 issued Aug. 30, 2024.
Office Action with regard to the counterpart U.S. Appl. No. 17/697,452 issued Sep. 6, 2024.

* cited by examiner

RACK SYSTEM FOR HOUSING AT LEAST ONE IMMERSION CASE

REFERENCE TO RELATED APPLICATION

The present application claims priority to European Patent Application EP21305427.3, which was filed Apr. 1, 2021, and to European Patent Application EP21306188.0, which was filed Aug. 31, 2021, the disclosures of both of which are incorporated by reference herein in their entirety.

TECHNICAL FIELD

The present technology relates to rack-mounted, liquid-cooled electronic equipment and, in particular, collapsible reservoirs for storing fluids in rack systems.

BACKGROUND

Large computing facilities endeavour to keep up with the market demand for increased processing resources. Such facilities may, therefore, implement a large number of rack systems configured to support thousands or even tens of thousands of electronic processing assemblies to accommodate the market demand.

It will be appreciated that such a multitude of racked electronic processing assemblies consume large amounts of power and, in turn, generate substantial amounts of heat that needs to be controlled in order to ensure proper processing performance. Various heat mitigation measures, such as, for example, liquid-cooling techniques, have been implemented to cool the racked electronic processing assemblies to acceptable temperature levels. In some instances, the liquid-cooling techniques involve submerging portions of the racked electronic processing assemblies in a liquid.

During maintenance operations of the racked electronic processing assemblies, said racked electronic processing assemblies can undergo racking and de-racking operations. These operations can result in liquid spillage, and can be difficult to perform due to a weight of the racked electronic processing assemblies. Furthermore, accessing portions of the racked electronic processing assemblies can be problematic as they are submerged in the liquid.

SUMMARY

It is an object of the present technology to ameliorate at least some of the inconveniences present in the prior art.

According to one aspect of the present technology, there is provided a rack system for housing at least one rack-mounted immersion case. The rack system includes a rack frame and at least one collapsible reservoir. The rack frame is configured to slidably accommodate racking and de-racking operations of the at least one rack-mounted immersion case within the rack system. The at least one collapsible reservoir is fluidly connected to the at least one rack-mounted immersion case. The at least one collapsible reservoir is configured to store a fluid. The at least one collapsible reservoir has a first portion fluidly connected to the at least one rack-mounted immersion case, and a second portion fixedly connected to the rack frame. The at least one collapsible reservoir is configured to respectively collapse and expand along a racked space and a de-racked space. The racked and de-racked spaces are defined between a backplane of the at least one rack-mounted immersion case and a backplane of the rack frame, in which the de-racked space is larger than the racked space.

In some embodiments, the first portion is fixedly connected to the backplane of the at least one rack-mounted immersion case, and the second portion is fixedly connected to the backplane of the rack frame.

In some embodiments, the at least one rack-mounted immersion case contains a fluid, and in response to de-racking the at least one rack-mounted immersion case, the at least one collapsible reservoir expands to allow some of the fluid to flow from the at least one rack-mounted immersion case to the at least one collapsible reservoir.

In some embodiments, the at least one collapsible reservoir is configured to draw fluid therein in response to de-racking the at least one rack-mounted immersion case.

In some embodiments, the at least one collapsible reservoir is configured to collapse and allow some of the fluid to flow from the at least one collapsible reservoir to the at least one rack-mounted immersion case in response to racking the at least one rack-mounted immersion case.

In some embodiments, the at least one collapsible reservoir is configured to eject fluid therefrom in response to racking the at least one rack-mounted immersion case.

In some embodiments, the at least one collapsible reservoir is configured so that expansion of the at least one collapsible reservoir increases a volume of the at least one collapsible reservoir.

In some embodiments, the at least one collapsible reservoir includes bellows.

In some embodiments, the at least one collapsible reservoir is configured to collapse linearly.

In some embodiments, the at least one collapsible reservoir is made from plastic.

In some embodiments, the fluid is a dielectric immersion cooling liquid.

In some embodiments, the rack system includes at least one articulating scissor structure and an opening within the rack frame. The opening is configured to accommodate at least one cable/tube bundle. The at least one cable/tube bundle services the at least one rack-mounted immersion case within the rack system. The at least one articulating scissor structure includes a first arm, a second arm and a joining portion. The first arm is detachably connected to a contact point on the backplane of the at least one rack-mounted immersion case. The second arm is detachably connected to a contact point on the backplane of the rack frame. The joining portion is connected the first and second arms. The at least one articulating scissor structure is configured to guide the at least one cable/tube bundle along the racked space and the de-racked space. The at least one articulating scissor structure is configured to laterally extend and guide the at least one cable/tube bundle across the de-racked space during the de-racking operation of the at least one rack-mounted immersion case. The at least one articulating scissor structure is configured to laterally contract and guide the cable/tube bundle within the racked space during the racking operation of the at least one rack-mounted immersion case.

In some embodiments, the at least one articulating scissor structure is configured to engage the at least one collapsible reservoir to induce collapse of the collapsible reservoir during the de-racking operation of the at least one rack-mounted immersion case.

In some embodiments, the at least one rack-mounted immersion case includes a plurality of rack-mounted immersion cases.

In some embodiments, the at least one collapsible reservoir includes a plurality of collapsible reservoirs.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

It must be noted that, as used in this specification and the appended claims, the singular form "a", "an" and "the" include plural referents unless the context clearly dictates otherwise.

As used herein, the term "and/or" is to be taken as specific disclosure of each of the two specified features or components with or without the other. For example "A and/or B" is to be taken as specific disclosure of each of (i) A, (ii) B and (iii) A and B, just as if each is set out individually herein.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects, and advantages of implementations of the present technology will become apparent from the following description, the accompanying drawings, and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1A:
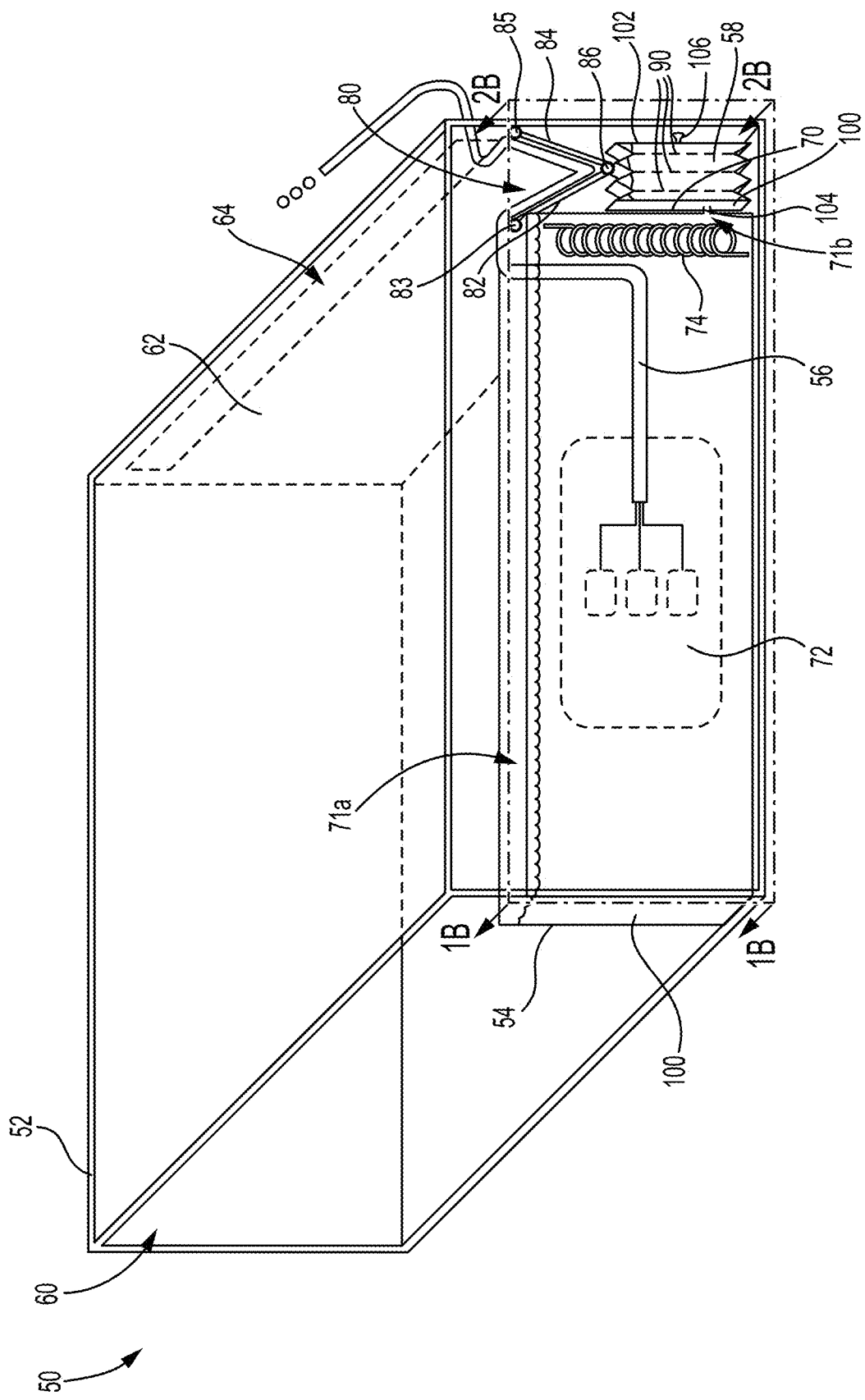
FIG. 1A is a perspective view of rack system having a rack-mounted immersion case in a racked position connected to a collapsible reservoir in accordance with an embodiment of the present technology.

It should be noted that the various Figures are not to scale.

DETAILED DESCRIPTION

The present disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including", "comprising", or "having", "containing", "involving" and variations thereof herein, is meant to encompass the items listed thereafter as well as, optionally, additional items. In the following description, the same numerical references refer to similar elements.

The present technology will be described with reference to a rack system 50 including a rack frame 52, a plurality of rack-mounted immersion cases 54 (only one immersion case 54 is shown in accompanying Figures) and a plurality of collapsible reservoirs 58 (only one collapsible reservoir 58 is shown in accompanying Figures).

The rack frame 52, which is configured to house and to slidably accommodate racking and de-racking operations of the rack-mounted immersion cases 54, defines a front opening 60 which, in part, enables the racking and de-racking operations. The rack frame 52 has a backplane 62 that defines an opening 64 configured to accommodate a plurality of cable/tube bundles 56 (only one cable/tube bundle 56 shown in accompanying Figures) therethrough. In some embodiments, there could be two or more openings 64 configured to receive two or more cable/tube bundles 56 therethrough. The rack frame 52 has a single shelf that is configured to receive, for example and without limitation, sixteen rack-mounted immersion cases 54 therein. It is contemplated that in other embodiments, the shelf could be configured to receive more or less than sixteen rack-mounted immersion cases 54 therein. For instance, in some embodiments, the shelf could be configured to receive only one rack-mounted immersion cases 54. It is also contemplated that in other embodiments, the rack frame 52 could have two or more vertical shelves.

The rack-mounted immersion cases 54 are analogous to book sleeves. As mentioned above, the rack-mounted immersion cases 54 are configured to be racked and de-racked. When the rack-mounted immersion cases 54 are racked (shown in FIGS. 1A and 1B), a racked space is defined between a backplane 70 of the immersion case 54 and the backplane 62 of the rack frame 52. When the rack-mounted immersion cases 54 are de-racked (shown in FIGS. 2A and 2B), a de-racked space is defined between the backplane 70 of the immersion case 70 and the backplane 62 of the rack frame 52. The de-racked space is larger than the racked space.

As the rack-mounted immersion cases 54 are all constructed in similar fashion, and are configured to by similarly racked and de-racked, only one will be described in detail. The rack-mounted immersion case 54 is configured to receive an electronic device 72 and a serpentine convection coil 74 therein through an upper aperture 71a defined in the rack-mounted immersion case 54. The electronic device 72 may for example comprise a server, a hard disk drive, a power supply, and the like. It is contemplated that in some embodiments, the serpentine convection coil 74 could be another heat exchanger. In some embodiments, the rack-mounted immersion case 54 could be configured to receive two or more electronic devices 72 and/or two or more serpentine convection coils 74 therein. The rack-mounted immersion case 54 also defines a rear aperture 71b, which as will be described below, is configured to fluidly connect the rack-mounted immersion case 54 to the collapsible reservoir 58. As will also be described below, the rack-mounted immersion case 54 is configured to be filled with a dielectric immersion cooling liquid which can aid in cooling the electronic device 72.

The rack system 50 also includes the plurality of the cable/tube bundles 56, where each one of the cable/tube bundles 56 services one rack-mounted immersion case 54 by carrying hot and/or cold fluid and/or communication signals and/or electrical current in and/or out the rack-mounted immersion case 54. In some embodiments, the fluid carried by the cable/tube bundles 56 is water. Thus, each of the cable/tube bundles 56 is operatively connected to one of the rack-mounted immersion cases 54.

The rack system 50 also includes a plurality of articulating scissor structures 80 (only one articulating scissor structure 80 shown in accompanying Figures). Each one of the articulating scissor structures 80 is detachably connected to one of the rack-mounted immersion cases 54. Thus, the rack system 50 includes as many articulating scissor structures 80 as rack-mounted immersion cases 54. In some embodiments, the number of articulating scissor structures 80 could be different from the number of rack-mounted immersion case 54. It is also contemplated that in some embodiments, the articulating scissor structures 80 could be omitted from the rack system 50.

The articulating scissor structure 80 has an arm 82, an arm 84 and a joining portion 86 that connects the arms 82, 84. The arm 82 is detachably connected to a contact point 83 on the backplane 70 of the rack-mounted immersion case 54, whereas the arm 84 is detachably connected to a contact point 85 on the backplane 62 of the rack frame 52. In some embodiments, the arms 82, 84 could include a hook, a catch, a clasp, a latch, a clip or a grommet to connect to the backplanes 62, 70. As will be described in greater detail below, the articulating scissor structure 80 is configured to laterally extend and contract to guide one of the cable/tube bundles 56 along the rack and de-racked spaces. Although the articulating scissor structure 80 is shown in the Figures as being positioned above the collapsible reservoir 58, positioning the articulating scissor structure 80 on a lateral side of the collapsible reservoir 58 is also contemplated.

The rack system 50 also includes the plurality of collapsible reservoirs 58, where each one of the collapsible reservoirs 58 is fluidly connected to one of the rack-mounted immersion cases 54. Thus, the rack system 50 may include as many collapsible reservoirs 58 as rack-mounted immersion cases 54. In some embodiments, the number of collapsible reservoirs 58 could be different from the number of rack-mounted immersion case 54. For instance, in some embodiments, one collapsible reservoir 58 could be fluidly connected to more than one rack-mounted immersion case 54.

The collapsible reservoir 58, which is configured to store a fluid therein, namely the dielectric immersion cooling liquid, has a front portion 100 and a rear portion 102. At the front portion 100, the collapsible reservoir 58 has a connecting part 104 that is configured to be received in or otherwise fluidly connected to the rear aperture 71b of the rack-mounted immersion case 54, thereby fluidly connecting the collapsible reservoir 58 to rack-mounted immersion case 54. In some embodiments, the front portion 100 could be configured to receive a connecting part projecting from the rack-mounted immersion case 54. In other embodiments, the connecting part 104 could be elsewhere on the collapsible reservoir 58, such as for instance at the rear portion 102. In the present embodiment, the front portion 100 is fixedly connected to the rack-mounted immersion case 54 by the connecting part 104. It is contemplated that in some embodiments, the collapsible reservoir 58 could be fixedly connected to the rack-mounted immersion case 54 by an additional connector such as a hook, a catch, a clasp, a latch, a clip or a grommet. The rear portion 102 is fixedly connected to the backplane 62 of the rack frame 52 by a hook 106. It is contemplated that in other embodiments, the hook 106 could be another connector such as a catch, a clasp, a latch, a clip or a grommet a latch or a clip.

The collapsible reservoir 58 includes bellows 90. The bellows 90 enable the collapsible reservoir 58 to linearly collapse and expand along the racked and de-racked spaces. Furthermore, the bellows 90 can induce a suction effect upon expansion, such the collapsible reservoir 58 can draw in the dielectric immersion cooling liquid while expanding. The connecting part 104 is positioned such that the connecting part 104 (i.e. the fluid connection between the collapsible reservoir 58 and the rack-mounted immersion case 54) is below an expected level of the dielectric immersion cooling liquid when the rack-mounted immersion case 54 is de-racked, which can prevent air from entering the collapsible reservoir 58.

In some embodiments, the bellows 90 could be omitted. In such embodiments, the collapsible reservoir 58 could still expand and collapse along the racked and de-racked spaces. For instance, in some embodiments, the collapsible reservoir 58 could be made from a malleable material. The collapsible reservoir 58 may be made from plastic, though it is contemplated that other suitable material such as rubber or silicone could be used.

Still referring to FIGS. 1A, 1B, 2A and 2B, a description of the present technology as it is being used will now be provided. As each one of the rack-mounted immersion cases 54 and features connected thereto (i.e. the cable/tube bundle 56, the collapsible reservoir 58 and the articulating scissor structure 80) is similar to one another, the description will only refer to one rack-mounted immersion case 54 and the features connected thereto.

Figure 1B:
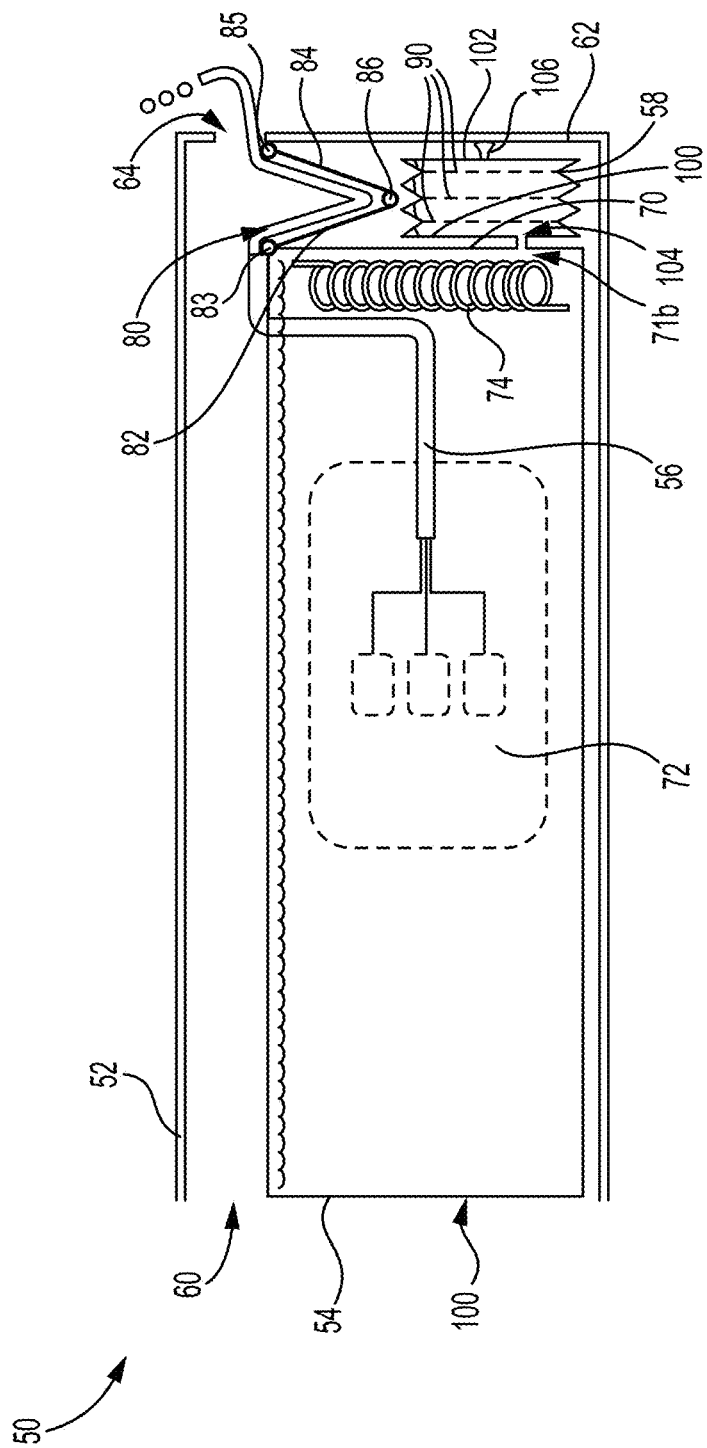
FIG. 1B is a cross-sectional view of the rack system of FIG. 1A taken across the plane 1B-1B of FIG. 1A.

As shown in FIGS. 1A and 1B, the rack-mounted immersion case 54 is racked in the rack frame 52. The rack-mounted immersion case 54 contains the dielectric immersion cooling liquid therein, and the cable/tube bundle 56 is operatively connected to the electronic device 72 and the serpentine convection coil 74, both of which are received in the rack-mounted immersion case 54. The arm 82 of the articulating scissor structure 80 is connected to the backplane 70, and the arm 84 is connected to the backplane 62. A portion of the cable/tube bundle 56 extends along the articulating scissor structure 80. The collapsible reservoir 58 is fluidly connected to backplane 70 of the rack-mounted immersion case 54. The collapsible reservoir 58 is collapsed, and contains a small volume of the dielectric immersion cooling liquid.

Cold water, or another fluid, may be carried by one of the tubes of the cable/tube bundle 56, and supplied to cooling blocks (not shown) mounted on the electronic device 72 to cool the electronic device 72. Subsequently, the water, which has increased in temperature but is expected to still be cooler than the dielectric immersion cooling liquid, is supplied to the serpentine convection coil 74. As the water flows through the serpentine convection coil 74, heat transfer between the serpentine convection coil 74 and the dielectric immersion cooling liquid induces convection of the dielectric immersion cooling liquid within the rack-mounted immersion case 54. The water then exits the serpentine convection coil 74 through another one of the tubes of the cable/tube bundle 56. Mounting the serpentine convention coil 74 upstream of the electronic device 72 along the path of the supplied water is also contemplated.

Figure 2A:
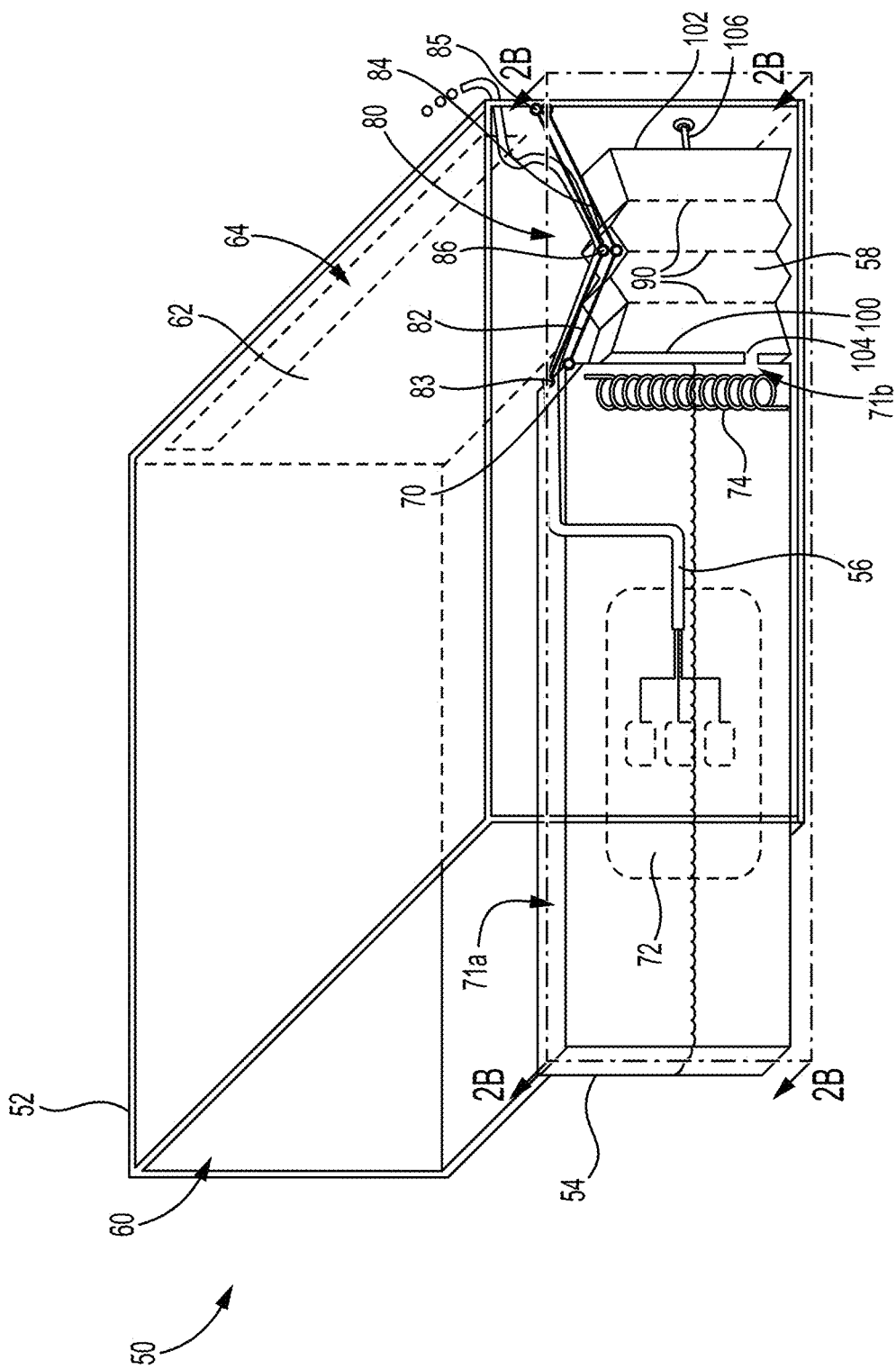
FIG. 2A is a perspective view of the rack system of FIG. 1A with the rack-mounted immersion case in a de-racked position.
Figure 2B:
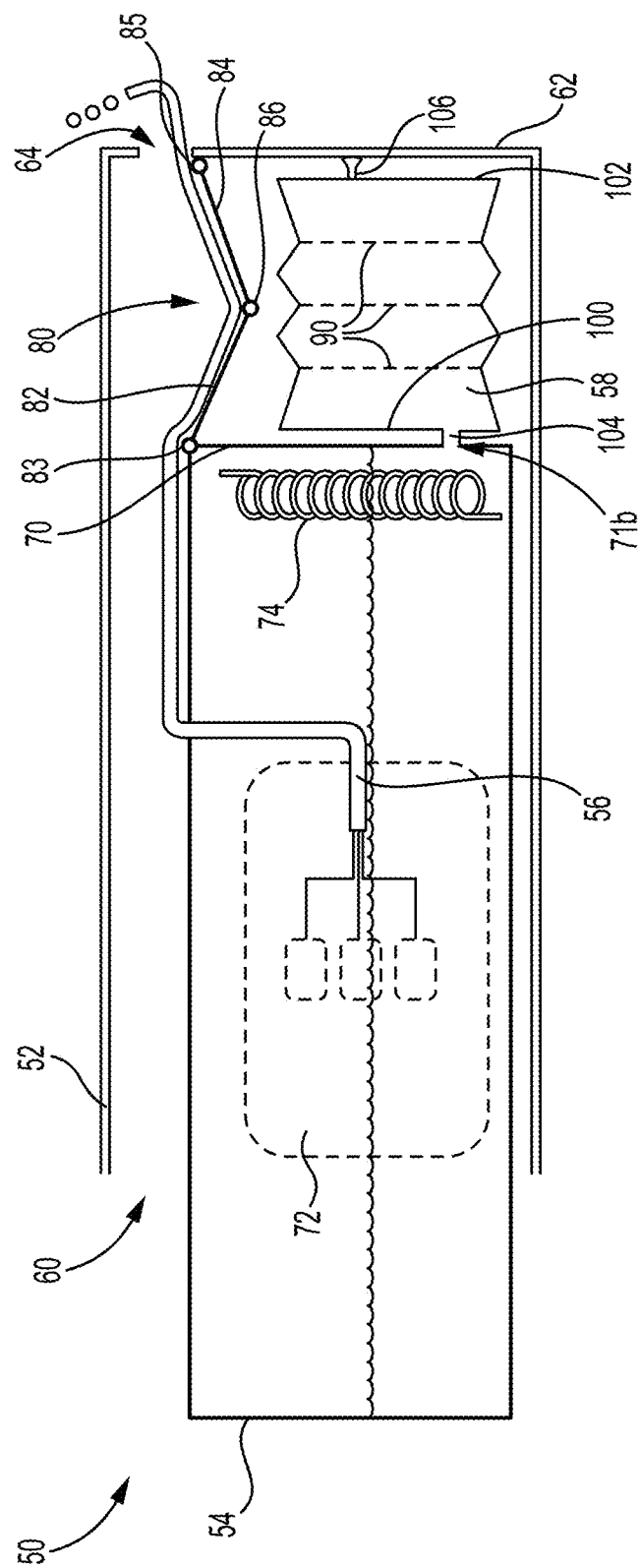
FIG. 2B is a cross-sectional view of the rack system of FIG. 2A taken across the plane 2B-2B of FIG. 2A.

Referring to FIGS. 2A and 2B, to access the electronic device 72, for instance to perform maintenance operations, the rack-mounted immersion case 54 can be slidingly de-racked.

While de-racking, the articulating scissor structure 80 laterally extends, and guides the cable/tube bundle 56 across the de-racked space. This enables the connections between the cable/tube bundle 56 and the rack-mounted immersion case 54 to not disconnect and to not tangle.

While de-racking, since the front portion 100 is fixedly connected to the backplane 70 and the rear portion 102 is fixedly connected to the backplane 62, the collapsible reservoir 58 expands along the de-racked spaced. When the collapsible reservoir 58 expands, a volume thereof increases. In response to the de-racking of the immersion case 70, some of the dielectric immersion cooling liquid flows from the immersion case 70 to the collapsible reservoir 58. This can occur because of hydrostatic pressure difference. In some embodiments, as mentioned above, due to the position of the connecting part 104 being lower than a level of the dielectric immersion cooling liquid in the de-racked position, some of the dielectric immersion cooling liquid can be drawn into the collapsible reservoir 58 by a suction effect resulting from the expansion of the collapsible reservoir 58.

As a result of some of the dielectric immersion cooling liquid flowing from rack-mounted immersion case 54 to the collapsible reservoir 58, access to the electrical device 72 is facilitated, as liquid level within the rack-mounted immersion case 54 is decreased. In addition, the decreased liquid level can reduce likelihood of dielectric immersion cooling liquid spilling from the rack-mounted immersion case 54 during the de-racking operation. Furthermore, sliding rack-mounted immersion case 54 also becomes easier as a weight thereof becomes smaller.

Then, referring back to FIGS. 1A and 1B, the rack-mounted immersion case 54 can be slidingly racked.

While racking, the articulating scissor structure 80 laterally contracts and guides the cable/tube bundle 56 within the racked space. This can help to reduce the chances of the cable/tube bundle 56 from tangling.

While racking, the articulating scissor structure 80 can engage the collapsible reservoir 58 to induce collapse of the collapsible reservoir 58. To this end, in some embodiments, the joining portion 86 of the articulating scissor structure 80 could be aligned with one of the bellows 90.

While racking, since the front portion 100 is fixedly connected to the backplane 70 and the rear portion 102 is fixedly connected to the backplane 62, the collapsible reservoir 58 collapses along the racked space. When the collapsible reservoir 58 collapses, the volume thereof decreases. In response to the racking of the rack-mounted immersion case 54, some of the dielectric immersion cooling liquid present in the collapsible reservoir 58 flows to the rack-mounted immersion case 54 through the connecting part 104. In some embodiments, this can occur because an ejection effect resulting from the collapse of the collapsible reservoir 58.

Figure 3A:
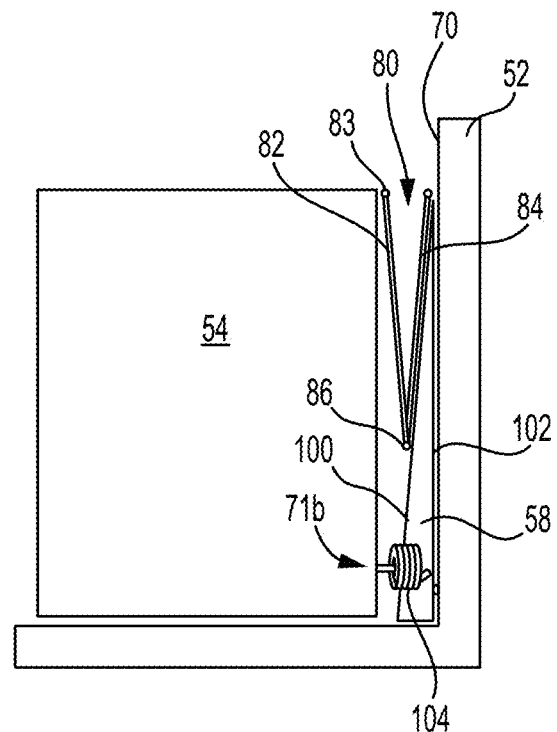
FIG. 3A is a left side elevation view of a rack system having a rack-mounted immersion case in a racked position connected to a collapsible reservoir in accordance to an alternate embodiment of the present technology.
Figure 3B:
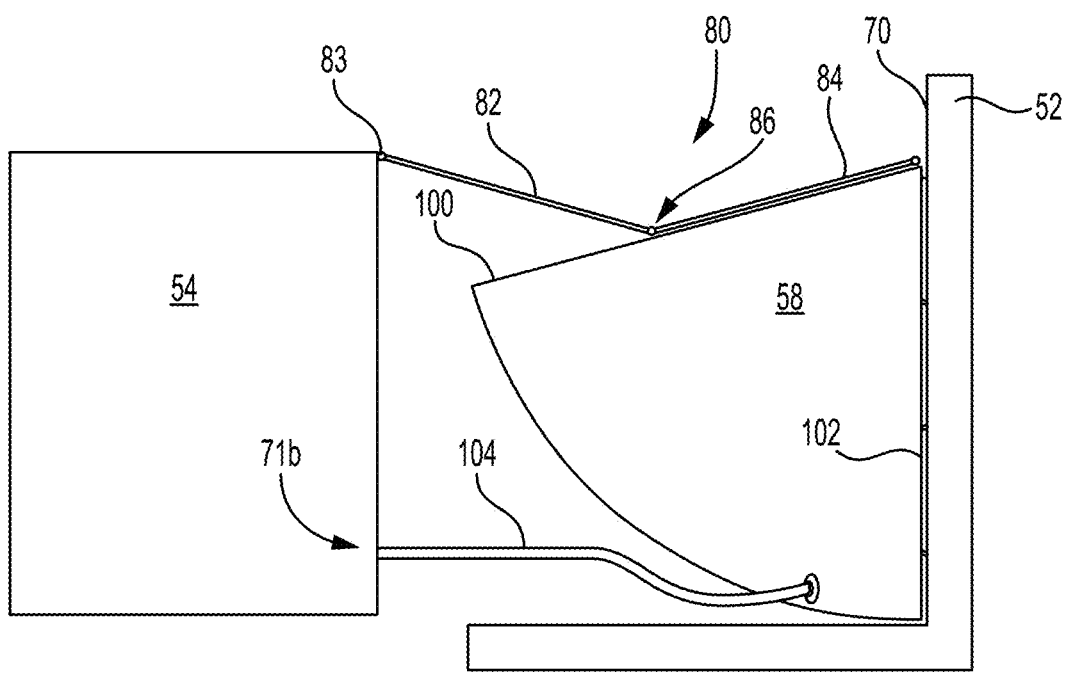
FIG. 3B is a left side elevation view of the rack system of FIG. 3A with the rack-mounted immersion case in de-racked position.

Referring now to FIGS. 3A and 3B a description of an alternate embodiment of the collapsible reservoir 58 will be provided. This embodiment is configured to connect to the rack-mounted immersion case 54 and to the rack frame 52 in a similar fashion to what is described above, and is configured to work similarly as well. Thus, this embodiment will only be briefly described.

The front portion 100 of the collapsible reservoir 58 is fixedly connected to the arm 84 of the articulating scissor structure 80, and the rear portion 100 of the collapsible reservoir 58 is directly connected to the backplane 70 of the rack frame 52. The collapsible reservoir 58 has the connecting part 104 that fluidly connects the collapsible reservoir 58 to the rack-mounted immersion case 54. The connecting part 104 is a fluid conduit, which can be bundled up (as shown in FIG. 3A) when the rack-mounted immersion case 54 is in the racked position, and can be unbundled as the rack-mounted immersion case 54 is moved from the racked position to the de-racked position.

In this embodiment, while de-racking the rack-mounted immersion case 54, the articulating scissor structure 80 laterally extends, and guides the cable/tube bundle 56 across the de-racked space. As the collapsible reservoir 58 is connected to the arm 84, this results in the collapsible reservoir 58 expanding rotationally, as shown in FIG. 3B.

Similarly, while racking the rack-mounted immersion case 54, the articulating scissor structure 80 laterally contracts and guides the cable/tube bundle 56 within the racked space. As the collapsible reservoir 58 is connected to the arm 84, this results in the collapsible reservoir 58 collapsing rotationally.

Modifications and improvements to the above-described embodiments of the present invention may become apparent to those skilled in the art. The foregoing description is intended to be exemplary rather than limiting. The scope of the present invention is therefore intended to be limited solely by the appended claims.

What is claimed is:

1. A rack system for housing at least one rack-mounted immersion case, comprising:
   a rack frame configured to allow slidable racking and slidable de-racking operations of the at least one rack-mounted immersion case within the rack system;
   at least one collapsible reservoir fluidly connected to the at least one rack-mounted immersion case, the at least one collapsible reservoir being configured to store a liquid and having a first portion connected to the at least one rack-mounted immersion case, and a second portion fixedly connected to the rack frame, and wherein:
   the at least one collapsible reservoir is configured to collapse along a racked space in response to a racking operation; and
   the at least one collapsible reservoir is configured to expand along a de-racked space in response to a de-racking operation,
   the racked and de-racked spaces being defined between a backplane of the at least one rack-mounted immersion case and a backplane of the rack frame, in which the de-racked space is larger than the racked space.

2. The rack system of claim 1, wherein:
   the first portion is fixedly connected to the backplane of the at least one rack-mounted immersion case; and
   the second portion is fixedly connected to the backplane of the rack frame.

3. The rack system of claim 1, wherein the at least one rack-mounted immersion case contains a liquid, and the at least one collapsible reservoir is configured to expand to allow some of the liquid to flow from the at least one rack-mounted immersion case to the at least one collapsible reservoir in response to de-racking the at least one rack-mounted immersion case.

4. The rack system of claim 3, wherein the at least one collapsible reservoir is configured to draw liquid therein in response to de-racking the at least one rack-mounted immersion case.

5. The rack system of claim 3, wherein the at least one collapsible reservoir is configured to collapse and allow some of the liquid to flow from the at least one collapsible reservoir to the at least one rack-mounted immersion case in response to racking the at least one rack-mounted immersion case.

6. The rack system of claim 5, wherein the at least one collapsible reservoir is configured to eject liquid therefrom in response to racking the at least one rack-mounted immersion case.

7. The rack system of claim 1, wherein the at least one collapsible reservoir includes bellows.

8. The rack system of claim 1, wherein the at least one collapsible reservoir is configured to collapse linearly.

9. The rack system of claim 1, wherein the at least one collapsible reservoir is made from plastic.

10. The rack system of claim 1, wherein the liquid is a dielectric immersion cooling liquid.

11. The rack system of claim 1, further comprising:
an opening within the rack frame configured to accommodate at least one cable/tube bundle, the at least one cable/tube bundle servicing the at least one rack-mounted immersion case within the rack system;
at least one articulating scissor structure comprising:
a first arm detachably connected to a contact point on the backplane of the at least one rack-mounted immersion case,
a second arm detachably connected to a contact point on the backplane of the rack frame, and
a joining portion connecting the first and second arms;
the at least one articulating scissor structure configured to guide the at least one cable/tube bundle along the racked space and the de-racked space, wherein,
the at least one articulating scissor structure is configured to laterally extend and guide the at least one cable/tube bundle across the de-racked space during the de-racking operation of the at least one rack-mounted immersion case, and
the at least one articulating scissor structure is configured to laterally contract and guide the cable/tube bundle within the racked space during the racking operation of the at least one rack-mounted immersion case.

12. The rack system of claim 11, wherein:
the at least one articulating scissor structure is configured to engage the at least one collapsible reservoir to induce collapse of the collapsible reservoir during the de-racking operation of the at least one rack-mounted immersion case.

13. The rack system of claim 1, wherein the at least one rack-mounted immersion case comprises a plurality of rack-mounted immersion cases.

14. The rack system of claim 1, wherein the at least one collapsible reservoir comprises a plurality of collapsible reservoirs.

* * * * *